United States Patent [19]

Masuoka

[11] Patent Number: 4,906,869

[45] Date of Patent: Mar. 6, 1990

[54] OUTPUT CIRCUIT HAVING WIDE RANGE FREQUENCY RESPONSE CHARACTERISTIC

[75] Inventor: Hideaki Masuoka, Yokohama, Japan

[73] Assignee: Kabushiki Kaisha Toshiba, Kawasaki, Japan

[21] Appl. No.: 201,219

[22] Filed: Jun. 2, 1988

[30] Foreign Application Priority Data

Jun. 3, 1987 [JP] Japan .................................. 62-138166

[51] Int. Cl.$^4$ ....................... H03K 19/086; H03K 5/12
[52] U.S. Cl. .................................... 307/455; 307/455; 307/263
[58] Field of Search ................. 307/443, 445, 455, 263

[56] References Cited

U.S. PATENT DOCUMENTS 4,644,194 2/1987 Birrittellon et al. ................. 307/443

Primary Examiner—Stanley D. Miller
Assistant Examiner—Margaret Rose Wambach
Attorney, Agent, or Firm—Finnegan, Henderson, Farabow, Garrett and Dunner

[57] ABSTRACT

An output circuit comprising a differential amplifier circuit for providing a pair of complementary output signals corresponding to an input signal supplied to first and second signal input terminals thereof, an output transistor having a base connected to one output node of the differential amplifier circuit, a collector connected to a first power source potential supply terminal, and an emitter connected to a signal output terminal, a current mirror circuit having a current input terminal connected to a current source and a current output terminal connected to the signal output terminal, and a capacitor connected between the other output node of the differential amplifier circuit and the current input terminal of the current mirror circuit.

19 Claims, 3 Drawing Sheets

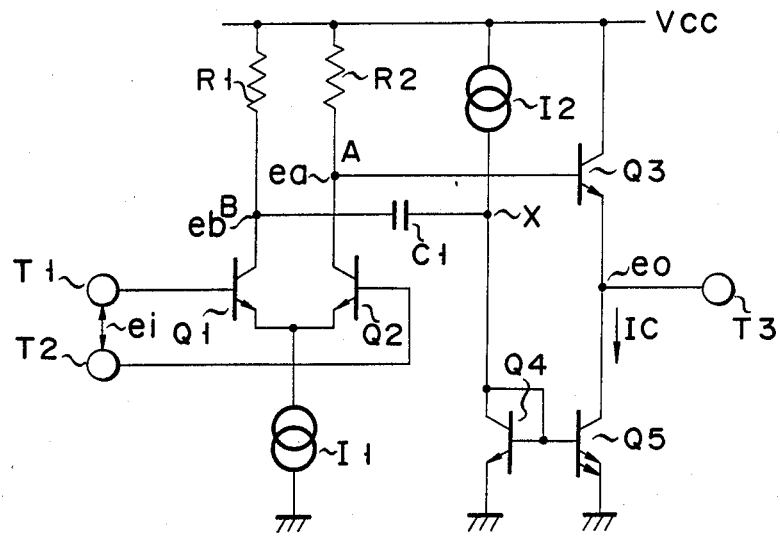
F I G. 1
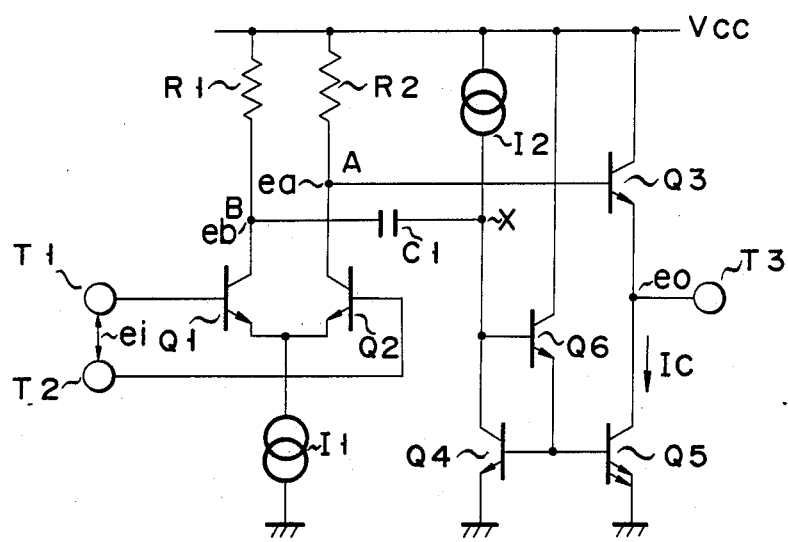
F I G. 2

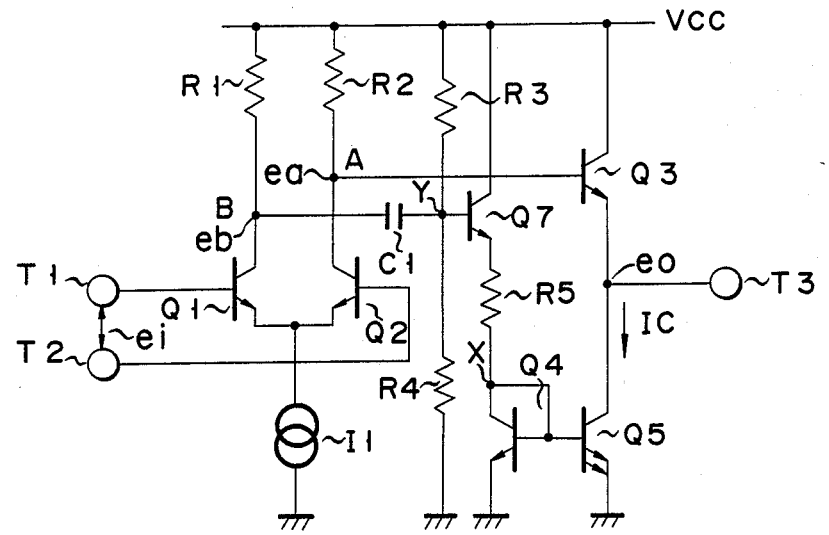
F I G. 3
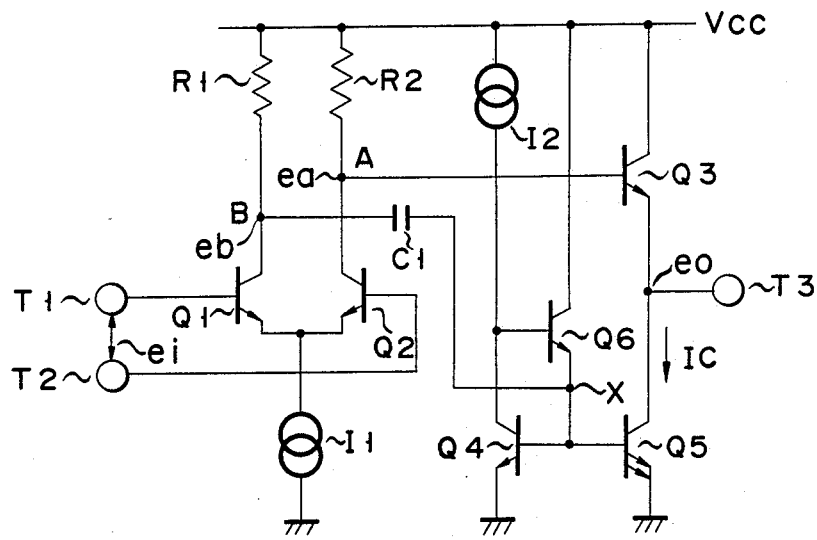
F I G. 4

OUTPUT CIRCUIT HAVING WIDE RANGE FREQUENCY RESPONSE CHARACTERISTIC

BACKGROUND OF THE INVENTION

1. Field of the Invention

This invention relates to an output circuit used in an output stage of an emitter coupled logic circuit (ECL) such as a prescaler for dividing a frequency.

2. Description of the Related Art

The circuit shown in FIG. 5 is a known output circuit used in an ECL circuit such as a prescaler, and includes a differential amplifier circuit constituted by NPN transistors Q1 and Q2, resistors R1 and R2, a constant current source I1, and a current mirror circuit constituted by NPN transistors Q4 and Q5. The above circuit is designed to increase an output current to output terminal T3 by applying a potential at node A, or at one of output nodes of the differential amplifier circuit, to the base of pull-up NPN transistor Q3, and to properly absorb a current introduced, via output terminal T3, by means of the current mirror circuit. The amount of a current introduced via output terminal T3 is equal to that of collector current Ic of transistor Q5, and can be set larger than the current supplied from constant current source I2 and used as an input current to the current mirror circuit, by making the dimensions of transistor Q5 larger than those of transistor Q4, as shown in FIG. 5.

In general, a circuit connected to output terminal T3 has an input capacitance of several pF to several tens pF. Therefore, when the frequency of an input signal supplied to input terminals T1 and T2 is high, the capacitive load of the output circuit becomes heavy. In FIG. 5, the load capacitor is indicated by CL.

At the time of the rising of an output signal which charges load capacitor CL, NPN transistor Q3 is operated as an emitter follower, so that the rate of rise of the output signal can be made high. However, at the time of discharging load capacitor CL or at the time of the falling of the output signal, current introduced or absorbed via output terminal T3 is limited by collector current Ic which is determined by current from constant current source I2, and therefore the rate of fall of the output current becomes low.

Variation of output signals Vout1 and Vout2 with respect to an input signal is shown in FIG. 6. In FIG. 6, the ordinate indicates a voltage and the abscissa indicates time. As can be seen from FIG. 6, the rate of fall of the output signal is relatively low and, therefore, transistor Q3 may be turned on before load capacitor CL is sufficiently discharged when the frequency of the input signal is high. In this case, the amplitude of the output signal is reduced, as is shown by output waveform Vout2.

The rate of fall of the output signal becomes lower as collector current Ic of transistor Q5 becomes small. Thus, the frequency response characteristics of output amplitude are deteriorated more as current Ic becomes smaller, as shown in FIG. 7. When current supplied via constant current source I2 is increased to improve its frequency response characteristic, a large amount of current must flow from power source terminal Vcc to the ground terminal, resulting in increasing the power consumption.

Since p-n junction capacitor Cbc is situated between the base and collector of transistor Q5 constituting the current mirror circuit, a displacement current flows into capacitor Cbc when an output signal voltage is changed, and it is additionally supplied as an input current to the current mirror circuit. Therefore, at the time of the rising of the output signal, a base current of transistor Q5 increases, as consequently does current Ic. Further, at the time of the falling of the output signal, the base current decreases, as does also current Ic. Such increasing/decreasing of current Ic has the effect of cancelling any change in an output current, as a result degrading the frequency response characteristics of the output amplitude.

SUMMARY OF THE INVENTION

The present invention has been developed in consideration of the problem described above, and has as an object to provide an output circuit which can effectively solve the problem associated with the prior art circuit, wherein the frequency response characteristics of an output signal cannot be improved without incurring an increase in power consumption, and which can attain good frequency response characteristics of an output signal with a low power consumption.

The above object can be achieved by an output circuit comprising a differential amplifier circuit for supplying a signal corresponding to a voltage difference between two input signals supplied to first and second signal input terminals thereof; an output transistor having a base connected to one of two output nodes of the differential amplifier circuit, a collector connected to a first power source potential supply terminal, and an emitter connected to a signal output terminal; a current mirror circuit having a current input terminal connected to a current source and a current output terminal connected to the signal output terminal; and a capacitor connected between the other output node of the differential amplifier circuit and the current input terminal of the current mirror circuit.

In the output circuit of the above construction, the amount of input current to the current mirror circuit can be changed according to an input signal thereof, via the capacitor connected between the other output node of the differential amplifier circuit and the current input terminal of the current mirror circuit. The input current to the current mirror circuit is reduced or increased, respectively, when the pull-up output transistor is turned on or off. Thus, the amount of a charging/discharging current to the capacitive load connected to the output terminal can be increased, without increasing the power source current, so that an output circuit with good frequency response characteristics of output amplitude can be obtained with a low power consumption.

BRIEF DESCRIPTION OF THE DRAWINGS

FIG. 1 is a circuit diagram of an output circuit according to one embodiment of this invention;

FIG. 2 is a circuit diagram of an output circuit according to another embodiment of this invention;

FIG. 3 shows an output circuit according to yet another embodiment of the invention;

FIG. 4 shows an output circuit according to still another embodiment of the invention;

DETAILED DESCRIPTION OF THE PREFERRED EMBODIMENTS

An embodiment of this invention will now be described, with reference to FIGS. 1 to 4.

Figure 5:
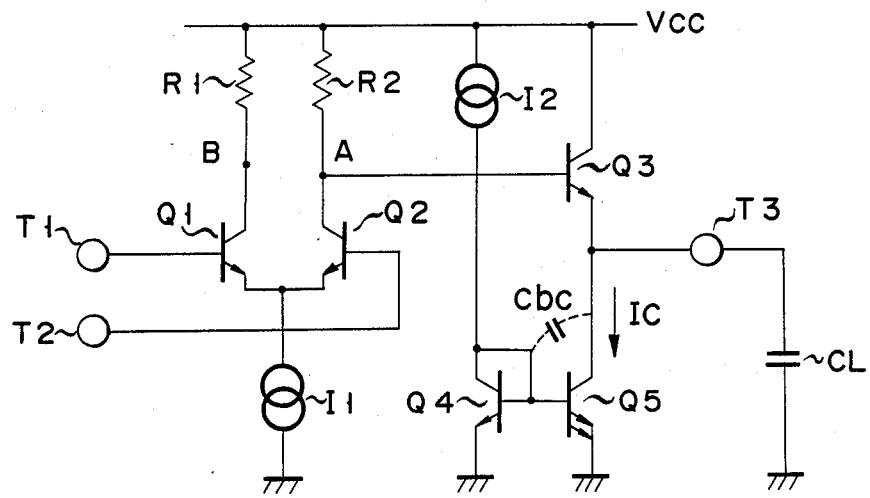
FIG. 5 is a circuit diagram of the prior art output circuit.
Figure 6:
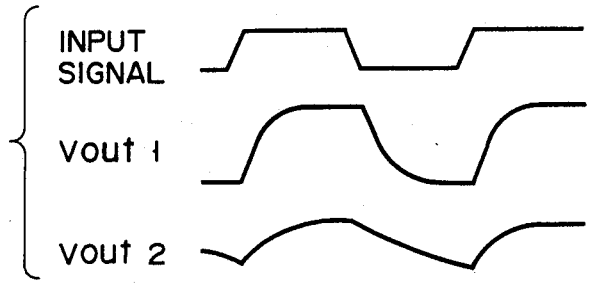
FIG. 6 shows input/output signal waveforms of the circuit of FIG. 5.
Figure 7:
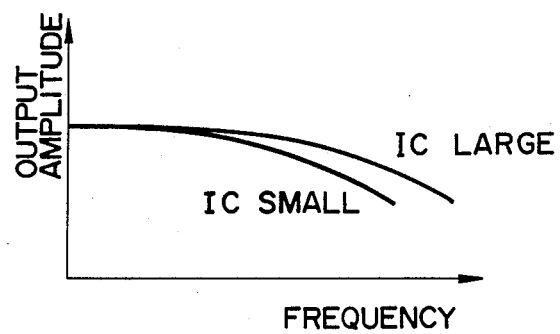
FIG. 7 illustrates frequency response characteristics of the circuit shown in FIG. 5.

FIG. 1 shows an output circuit according to one embodiment of this invention. This circuit is similar to the prior art output circuit of FIG. 5 in that it is constituted to increase an output current to output terminal T3 by applying a potential at one output node (A) of a differential amplifier circuit (Q1, Q2, R1, R2, I1) to the base of pull-up NPN transistor Q3, and to properly absorb a current, introduced via output terminal T3, by means of a current mirror circuit which is constituted by NPN transistors Q4 and Q5.

However, the output circuit of FIG. 1 further includes capacitor C1 which is connected between the other node (B) of the differential amplifier circuit and the current input terminal (X) of the current mirror circuit so as to change the amount of an input current to the current mirror circuit according to input signal ei. Further, transistor Q5 constituting the current mirror circuit is designed to have larger dimensions than transistor Q4, to set output current Ic of the current mirror circuit larger than the output current of constant current source I2.

Potentials (ea, eb) on output nodes A and B of the differential amplifier circuit are set in opposite phases. Thus, when potential ea at node A rises, potential eb at node B falls. At this time, the base potentials of transistors Q4 and Q5 are kept substantially constant, and the potential difference between two ends of capacitor C1 decreases, causing capacitor C1 to be discharged. The discharging current from capacitor C1 is superposed on the output current from constant current source I2. However, since it flows in a direction opposite to that of current I2, an input current to the current mirror circuit is reduced. As a result, output current Ic of the current mirror circuit decreases. In this case, since transistor Q3 functions as an emitter follower circuit, the potential at output terminal T3 rises when potential ea at node A rises. At this time, current Ic of transistor Q5 decreases to cause an output current from transistor Q3 to output terminal T3 to be increased. Thus, the operation speed at the time of the rising of the output signal can be enhanced.

When potential ea at node A falls and potential eb at node B rises, the potential difference between two ends of capacitor C1 increases, and a charging current of capacitor C1 is superposed on current I2 and then supplied as an input current to the current mirror circuit. In this case, since the charging current of capacitor C1 flows in the same direction as current I2, the input current to the current mirror circuit increases, which results in an increase in the amount of current flowing into transistor Q5, via output terminal T3. Further, when potential ea at node A rises, potential eb at node B falls and transistor Q3 is turned off. This action provides an increase in the current flowing into transistor Q5, and the increase in current causes the operation speed at the time of the falling of the output signal to be enhanced.

In this way, it is possible to change the input current to the current mirror circuit according to an input signal by use of capacitor C1 so as to increase input current to and output current from the output terminal at the time of rise and fall of the output signal. Therefore, charging and discharging currents of the load capacitor at terminal T3 can be increased without increasing the power source current, and thus an output circuit with good frequency response characteristics of output amplitude can be obtained with a low power consumption.

In summary, transistors Q3 and Q5 operate in a push-pull fashion at high frequency region. This push-pull fashion improves the output amplitude characteristic of the output circuit.

FIG. 2 shows a second embodiment of the invention, in which NPN transistor Q6 is used to reduce a current error of the current mirror circuit. Even when the current mirror circuit is formed as shown in FIG. 2, the frequency response characteristics of output amplitude can be improved in the same manner as in the embodiment of FIG. 1.

FIG. 3 shows an output circuit according to a third embodiment of the invention. In this embodiment, constant current source I2 of FIG. 1 is replaced by a voltage source (emitter follower circuit). More specifically, current input terminal X of the current mirror circuit is connected to the emitter of NPN emitter follower transistor Q7, via level shifting resistor R5. The collector of transistor Q7 is connected to the Vcc power supply circuit, and the base thereof is connected to node Y located between serially connected resistors R3 and R4. Capacitor C1 is inserted between node Y and output node B of the differential amplifier.

FIG. 4 shows a fourth embodiment of the invention. This embodiment is a modification of FIG. 2, wherein current input terminal X of the current mirror circuit is set at the emitter side of transistor Q6.

The embodiments shown in FIGS. 3 and 4 can improve the frequency response characteristic because transistors Q3 and Q5 can operate in a push-pull fashion at high frequency, transistor Q3 being driven by inphase signal ea while transistors Q4 and Q5 are driven by anti-phase signal eb, via capacitor C1.

Further, the differential amplifier circuit and/or the current mirror circuit is not limited to those shown in FIGS. 1 to 4, and can be modified in various forms.

As has been described above, according to this invention, an output circuit with good frequency response characteristics of output amplitude can be obtained with a low power consumption.

While the present invention has been described in connection with what is presently considered to be the most practical and preferred embodiment, it is to be understood that the invention is not limited to the disclosed embodiment but, on the contrary, is intended to cover various modifications and equivalent arrangements included within the scope of the appended claims, which scope is to be accorded the broadest interpretation so as to encompass all such modifications and equivalent arrangements.

What is claimed is:

1. An output circuit having a wide range frequency response characteristic, comprising:
input circuit means for supplying a first node with a first signal being in-phase to an input signal, and supplying a second node with a second signal being anti-phase to the input signal;
first output circuit means, coupled to said first node, for providing a first output current which varies in response to the first signal;
second output circuit means, coupled to said second node, for providing a second output current which is anti-phasic to said first output current and varies in response to the second signal, wherein a frequency response of the second output current with respect to the input signal is extended as a frequency of the input signal increases; and an output terminal, coupled to said first and second output circuit means, for providing a current obtained by combining said first and second output currents.

2. An output circuit according to claim 1, wherein said second output means includes:

a current mirror circuit having a current output terminal and a current input terminal, said second output current being substantially proportional to an input current supplied to the current input terminal and being delivered from the current output terminal; and a capacitor inserted between the current input terminal of said current mirror circuit and said second node.

3. An output circuit according to claim 1, wherein said second output circuit means further includes:

a current source for supplying a predetermined current to the current input terminal of said current mirror circuit.

4. An output circuit according to claim 2, wherein said second output circuit means further includes:

an emitter follower circuit having a base circuit coupled to the second node, via said capacitor, and an emitter circuit coupled to the current input terminal of said current mirror circuit.

5. An output circuit according to claim 2, wherein said current mirror circuit includes:

a first transistor of a first conductivity type having a base and collector both connected to said current input terminal; and a second transistor of the first conductivity type having a base connected to the base of said first transistor and a collector connected to said output terminal.

6. An output circuit according to claim 2, wherein said current mirror circuit includes:

a first transistor of a first conductivity type having a collector connected to said current input terminal;

a second transistor of the first conductivity type having a collector connected to said output terminal; and a third transistor of the first conductivity type having a base connected to said current input terminal and an emitter connected to the base of each of said first and second transistors.

7. An output circuit according to claim 2, wherein said current mirror circuit includes:

a first transistor of a first conductivity type having a base connected to said current input terminal;

a second transistor of the first conductivity type having a base connected to said current input terminal, and a collector connected to said output terminal; and a third transistor of the first conductivity type having a base connected to the collector of said first transistor, and an emitter connected to the base of each of said first and second transistors.

8. An output circuit according to claim 5, wherein said first output circuit means includes:

an output transistor of the first conductivity type having a base connected to said first node and an emitter connected to said output terminal.

9. An output circuit according to claim 5, wherein an emitter size of said second transistor is larger than that of said first transistor.

10. An output circuit according to any one of claims 5 to 9, wherein said input circuit means includes:

a differential transistor pair of a first conductivity type having a differential input for receiving said input signal, and outputting said first and second signals to said first and second nodes, respectively.

11. An output circuit according to claim 6, wherein said first output circuit means includes:

an output transistor of the first conductivity type having a base connected to said first node and an emitter connected to said output terminal.

12. An output circuit according to claim 7, wherein said first output circuit means includes:

an output transistor of the first conductivity type having a base connected to said first node and an emitter connected to said output terminal.

13. An output circuit according to claim 6, wherein an emitter size of said second transistor is larger than that of said first transistor.

14. An output circuit according to claim 7, wherein an emitter size of said second transistor is larger than that of said first transistor.

15. An output circuit according to claim 6, wherein said input circuit means includes:

a differential transistor pair of a first conductivity type having a differential input for receiving said input signal, and outputting said first and second signals to said first and second nodes, respectively.

16. An output circuit according to claim 7, wherein said input circuit means includes:

a differential transistor pair of a first conductivity type having a differential input for receiving said input signal, and outputting said first and second signals to said first and second nodes, respectively.

17. An output circuit according to claim 8, wherein said input circuit means includes:

a differential transistor pair of a first conductivity type having a differential input for receiving said input signal, and outputting said first and second signals to said first and second nodes, respectively.

18. An output circuit according to claim 9, wherein said input circuit means includes:

a differential transistor pair of a first conductivity type having a differential input for receiving said input signal, and outputting said first and second signals, to said first and second nodes, respectively.

19. An output circuit comprising:

a differential amplifier circuit having two output nodes for supplying an output signal across said two output nodes corresponding to a voltage difference between input signals supplied to first and second input terminals of said differential amplifier circuit;

an NPN transistor having a base connected to one of the output nodes of said differential amplifier circuit, a collector connected to a first power source potential supplying terminal, and an emitter connected to an output signal terminal;

a current mirror circuit having a current input terminal connected to a current source and a current output terminal connected to said output signal terminal; and a capacitor connected between the other output node of said differential amplifier circuit and the current input terminal of said current mirror circuit.

* * * * *